United States Patent
Lee et al.

(10) Patent No.: US 8,017,502 B2
(45) Date of Patent: Sep. 13, 2011

(54) WAFER SYSTEM WITH PARTIAL CUTS

(75) Inventors: Taewoo Lee, Icheon-Si (KR); Sang-Ho Lee, Kyounggi (KR)

(73) Assignee: Stats Chippac Ltd., Singapore (SG)

( * ) Notice: Subject to any disclaimer, the term of this patent is extended or adjusted under 35 U.S.C. 154(b) by 208 days.

(21) Appl. No.: 11/615,929

(22) Filed: Dec. 22, 2006

(65) Prior Publication Data

US 2008/0153262 A1 Jun. 26, 2008

(51) Int. Cl.
*H01L 21/301* (2006.01)

(52) U.S. Cl. .................. 438/462; 438/459; 438/460

(58) Field of Classification Search .................. 438/462, 438/459, 460
See application file for complete search history.

(56) References Cited

U.S. PATENT DOCUMENTS

| | | | |
|---|---|---|---|
| 7,060,532 B2 | 6/2006 | Takyu et al. | |
| 7,122,447 B2 | 10/2006 | Abe | |
| 7,135,384 B2 | 11/2006 | Takyu et al. | |
| 7,140,951 B2 | 11/2006 | Kurosawa | |
| 7,141,487 B2 | 11/2006 | Periasamy et al. | |
| 2006/0043533 A1* | 3/2006 | Lake | 257/618 |
| 2007/0238805 A1* | 10/2007 | Maeda et al. | 522/109 |
| 2008/0064137 A1* | 3/2008 | O'Donnell | 438/106 |

\* cited by examiner

*Primary Examiner* — Long Pham
(74) *Attorney, Agent, or Firm* — Mikio Ishimaru

(57) ABSTRACT

A wafer system is provided including providing a wafer having a topside and a backside, forming a partial cut from the topside of the wafer within a wafer rim and thinning the wafer from the backside for exposing the partial cut at the backside within the wafer rim.

20 Claims, 5 Drawing Sheets

WAFER SYSTEM WITH PARTIAL CUTS

TECHNICAL FIELD

The present invention relates generally to wafer manufacturing system and more particularly to semiconductor manufacturing system.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Every new generation of integrated circuits with increased operating frequency, performance and the higher level of large scale integration have underscored the need for back-end semiconductor manufacturing to provide more solutions involving the integrated circuit itself.

Numerous technologies have been developed to meet these requirements. Some of the research and development strategies focus on package technologies while others focus on improving the semiconductor technologies and manufacturing. Both approaches may include additional processing of the integrated circuits to better match the targeted package.

Integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density. Manufacturing integrated circuits having a thinner profile is one approach taken to increase integrated circuit density in the ever shrinking "real estate". The integrated circuits may undergo thinning process at the wafer level.

Wafer level thinning performs thinning on the inactive or backside of the wafer through processes such as lapping, grinding, or back-lapping. However, the demands for large volume of integrated circuits push wafer fabrication to increase diameters that exacerbating wafer warpage or bowing. The wafer warpage leads to uneven thinning and breakage not only during wafer level thinning but also throughout manufacturing handling.

As the demand for smaller electronic devices grows, manufacturers are seeking ways to reduce the size and weight of the packaged integrated circuits. To meet these needs, packaging technologies are shifting towards thinner profiles with more die stacking and/or wafer level packaging in bare die form. This drives the demand for better wafer thinning technology to achieve a very thin wafer thickness.

Existing technology has attempted to reduce wafer stress during wafer thinning processes so that higher wafer production can be achieved. In addition to reducing wafer stress, some attempts also address wafer strength during processing hoping to avoid the effects of wafer stress. Dicing Before Backgrind (DBG) is an attempt to obtain an ultra thin wafer thickness.

However, DBG approach reduces wafer stress within the wafer itself but presents other problems. DBG typically requires additional steps and materials. For example, DBG requires an additional backside die attach film (DAF) cut step after the back-grinding step. Also, DBG typically requires a dedicated laser for cutting the die attach film. Moreover, DBG requires special alignment systems to mitigate the difficulties cutting the die attach film of the separate dice. Another factor is the increase in cost from grinding tape required to be thick and have high adhesion strength to hold the separated dice.

Thus, a need still remains for a wafer system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a wafer system including providing a wafer having a topside and a backside, forming a partial cut from the topside of the wafer within a wafer rim and thinning the wafer from the backside for exposing the partial cut at the backside within the wafer rim.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
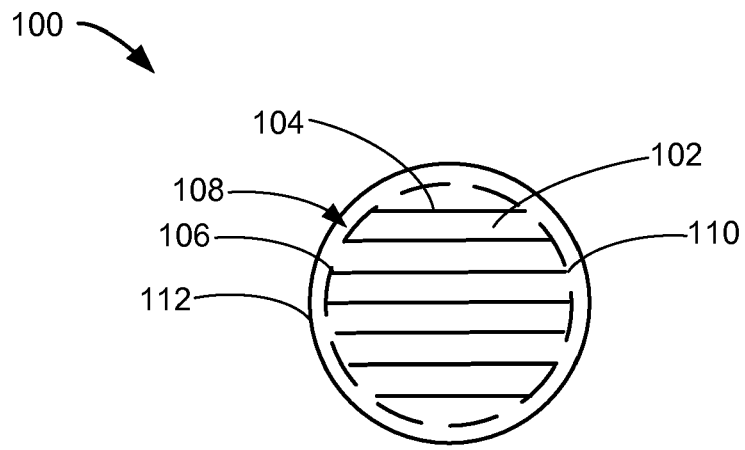
FIG. 1 is a top view of a wafer system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a wafer system 100 in an embodiment of the present invention. The top view depicts a topside 102 of the wafer system 100. The topside 102 has circuitry (not shown) fabricated thereon. The top view also depicts partial cut chords 104 that are all formed in one direction. The partial cut chords 104 can be substantially parallel to the rows of the integrated circuit dice (not shown) along the topside 102. The partial cut chords 104 are half cuts or cuts into the wafer system 100 without traversing through the entire thickness (not shown) of the wafer system 100.

Each of the partial cut chords 104 traverses from a first point 106 of a wafer rim 108 to a second point 110 of the wafer rim 108, wherein the first point 106 and the second point 110 are not the same location of the wafer rim 108. The wafer rim 108 may include the integrated circuit die (not shown) and a wafer edge 112 or the integrated circuit die at each end of the row of integrated circuit dice. The wafer rim 108 is at the peripheral region of the wafer system 100 and may include integrated circuit dice (not shown) at the wafer edge 112.

For illustrative purposes, the wafer system 100 is described as having the circuitry along the topside 102, although it is understood that the wafer system 100 may not have circuitry. For example, the wafer system 100 may contain other structures, such as spacer structures, stiffening structures, heat dissipation structures, or microelectricalmechanical systems (MEMS).

Also for illustrative purposes, the partial cut chords 104 are shown as evenly spaced and distributed along the topside 102, although it is understood that the partial cut chords 104 may not be evenly spaced, such as for a multi-project test wafers having many different integrated circuit designs (not shown) of various sizes. Further for illustrative purposes, the wafer system 100 is shown having the partial cut chords 104 as all the cut lines, although it is understood that the wafer system 100 may have different types of cut lines than the partial cut chords 104.

It has been discovered that the present invention provides the partial cuts formed in the inner part, not extending to the wafer edges, mitigate or eliminate wafer warpage even with a wafer that has undergone back grinding. The inner partial cuts reduce or eliminate edge chipping. The inner partial cuts obviate the need for special alignment systems or equipments by not separating each integrated circuit die (not shown) with the inner partial cuts. This also allows use of conventional grinding tape and avoids a higher cost thick high adhesion strength grinding tape. The inner partial cuts also obviate the need for a dedicated laser for die attach film cut that is needed in conventional dicing before grinding technique.

Figure 2:
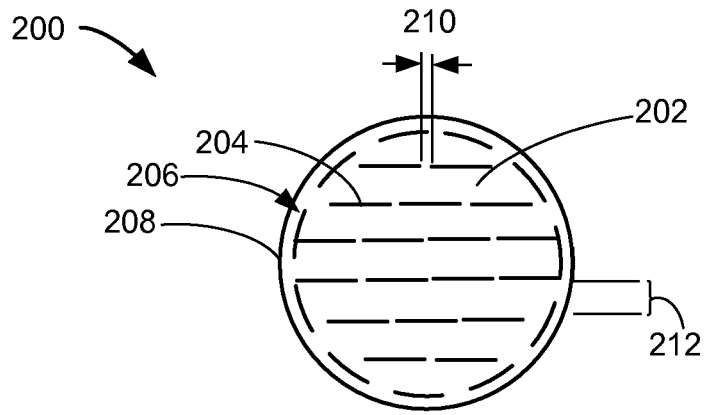
FIG. 2 is a top view of a wafer system in an alternative embodiment of the present invention.

Referring now to FIG. 2, therein is shown a top view of a wafer system 200 in an alternative embodiment of the present invention. The top view depicts a topside 202 of the wafer system 200. The topside 202 has circuitry (not shown) fabricated thereon. The top view also depicts partial cut line segments 204 that are substantially parallel to the rows the integrated circuit dice (not shown) along the topside 202. The partial cut line segments 204 are half cuts or cuts into the wafer system 200 without traversing through the entire thickness (not shown) of the wafer system 200.

The partial cut line segments 204 traverses from one end of a wafer rim 206 to the opposite end of the wafer rim 206. The wafer rim 206 may include the integrated circuit die (not shown) and a wafer edge 208 or the integrated circuit die at each end of the row of integrated circuit dice. Segment gaps 210 are shown between the partial cut line segments 204 along a row of integrated circuit dice. The wafer rim 206 is at the peripheral region of the wafer system 200.

For illustrative purposes, the wafer system 200 is described as having the circuitry along the topside 202, although it is understood that the wafer system 200 may not have circuitry. For example, the wafer system 200 may contain other structures, such as spacer structures, stiffening structures, heat dissipation structures, or microelectricalmechanical systems (MEMS).

Also for illustrative purposes, rows 212 of the partial cut line segments 204 are shown as evenly spaced and distributed along the topside 202, although it is understood that the rows 212 of the partial cut line segments 204 may not be evenly spaced, such as for a multi-project test wafers having many different integrated circuit designs (not shown) of various sizes. Further for illustrative purposes, the wafer system 200 is shown having the partial cut line segments 204 as all the cut lines, although it is understood that the wafer system 200 may have different types of cut lines than the partial cut line segments 204, such as the partial cut chords 104 of FIG. 1. Yet further for illustrative purposes, the segment gaps 210 are shown substantially the same across the wafer system 200, although it is understood that the segment gaps 210 may not be substantially the same, such as having different lengths.

Figure 3:
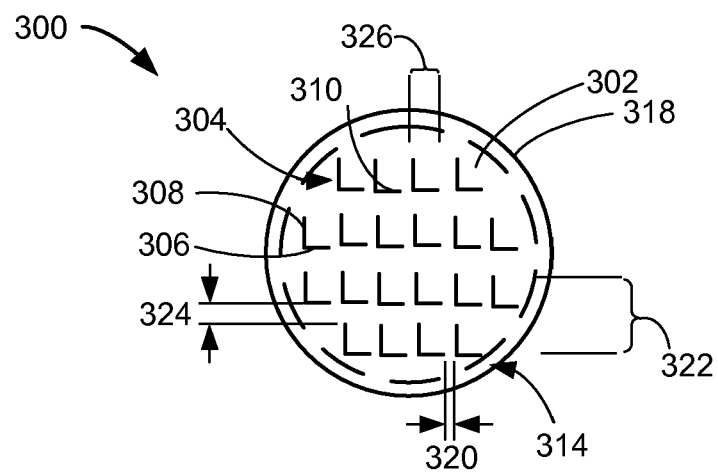
FIG. 3 is a top view of a wafer system in another alternative embodiment of the present invention.

Referring now to FIG. 3, therein is shown a top view of a wafer system 300 in another alternative embodiment of the present invention. The top view depicts a topside 302 of the wafer system 300. The topside 302 has circuitry (not shown) fabricated thereon. The top view also depicts partial cut jogged segments 304 that are substantially parallel to the rows and the columns the integrated circuit dice (not shown) along the topside 302. The partial cut jogged segments 304 are half cuts or cuts into the wafer system 300 without traversing through the entire thickness (not shown) of the wafer system 300.

A first segment 306 of each of the partial cut jogged segments 304 is substantially parallel to the rows of the integrated circuit dice. A second segment 308 of each of the partial cut jogged segments 304 is substantially parallel to the columns of the integrated circuit dice. The first segment 306 and the second segment 308 intersect forming a jog at a corner 310 of each of the partial cut jogged segments 304.

The partial cut jogged segments 304 are within a wafer rim 314. The wafer rim 314 may include the integrated circuit die (not shown) and a wafer edge 318 or the integrated circuit die at each end of the row or the column of integrated circuit dice. The wafer rim 314 is at the peripheral region of the wafer system 300.

First segment gaps 320 are shown between the partial cut jogged segments 304 along rows of integrated circuit dice and rows 322 of the partial cut jogged segments 304. Second segment gaps 324 are shown between the rows 322 and along columns 326 of the partial cut jogged segments 304. Each of the partial cut jogged segments 304 may form part of an outline for an integrated circuit die (not shown) or multiple integrated circuit dice.

For illustrative purposes, the wafer system 300 is described as having the circuitry along the topside 302, although it is understood that the wafer system 300 may not have circuitry. For example, the wafer system 300 may contain other structures, such as spacer structures, stiffening structures, heat dissipation structures, or microelectricalmechanical systems (MEMS).

Also for illustrative purposes, the rows 322 and the columns 326 of the partial cut jogged segments 304 are shown as evenly spaced and distributed along the topside 302, although it is understood that the rows 322 or the columns 326 of the partial cut jogged segments 304 may not be evenly spaced, such as for a multi-project test wafers having many different integrated circuit designs (not shown) of various sizes. Further for illustrative purposes, the wafer system 300 is shown having the partial cut jogged segments 304 as all the cut lines, although it is understood that the wafer system 300 may have different types of cut lines than the partial cut jogged segments 304, such as the partial cut chords 104 of FIG. 1.

Yet further for illustrative purposes, the first segment gaps 320 and the second segment gaps 324 are shown substantially the same across the wafer system 300, although it is understood that the first segment gaps 320 and the second segment gaps 324 may not be substantially the same, such as having different lengths. Yet further for illustrative purposes, the first segment 306 and the second segment 308 of each of the partial cut jogged segments 304 are in contact, although it is understood that the first segment 306 and the second segment 308 of each of the partial cut jogged segments 304 may not be in contact.

Figure 4:
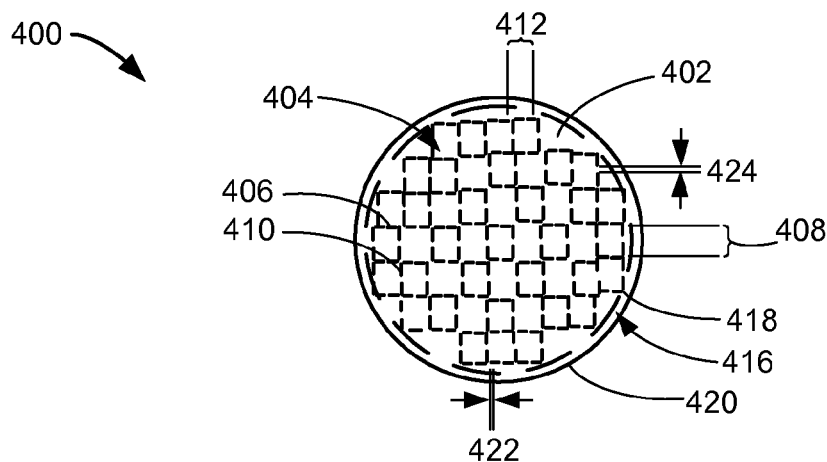
FIG. 4 is a top view of a wafer system in yet another embodiment of the present invention.

Referring now to FIG. 4, therein is shown a top view of a wafer system 400 in yet another embodiment of the present invention. The top view depicts a topside 402 of the wafer system 400. The topside 402 has circuitry (not shown) fabricated thereon. The top view also depicts partial cut gridded segments 404 that are substantially parallel to the rows and the columns of the integrated circuit dice (not shown) along the topside 402. The partial cut gridded segments 404 are half cuts or cuts into the wafer system 400 without traversing through the entire thickness (not shown) of the wafer system 400.

First segments 406 of each of the partial cut gridded segments 404 are substantially parallel to the rows of the integrated circuit dice and rows 408 of the partial cut gridded segments 404. Second segments 410 of each of the partial cut gridded segments 404 are substantially parallel to the columns of the integrated circuit dice and columns 412 of the partial cut gridded segments 404.

The partial cut gridded segments 404 are within a wafer rim 416. The wafer rim 416 may include the integrated circuit die (not shown) and a wafer edge 420 or the integrated circuit die at each end of the row or the column of integrated circuit dice. The wafer rim 416 is at the peripheral region of the wafer system 400.

First segment gaps 422 are shown between the first segments 406 along the rows 408 of the partial cut gridded segments 404. Second segment gaps 424 are shown between the second segments 410 along the columns 412 of the partial cut gridded segments 404. Each of the partial cut gridded segments 404 may form an outline for an integrated circuit die (not shown) or multiple integrated circuit dice.

For illustrative purposes, the wafer system 400 is described as having the circuitry along the topside 402, although it is understood that the wafer system 400 may not have circuitry. For example, the wafer system 400 may contain other structures, such as spacer structures, stiffening structures, heat dissipation structures, or microelectricalmechanical systems (MEMS).

Also for illustrative purposes, each of the partial cut gridded segments 404 are shown as similarly sized along the topside 402, although it is understood that the partial cut gridded segments 404 may not be similarly sized, such as for a multi-project test wafers having many different integrated circuit designs (not shown) of various sizes. Further for illustrative purposes, the wafer system 400 is shown having the partial cut gridded segments 404 as all the cut lines, although it is understood that the wafer system 400 may have different types of cut lines than the partial cut gridded segments 404, such as the partial cut chords 104 of FIG. 1.

Yet further for illustrative purposes, the first segment gaps 422 and the second segment gaps 424 are shown substantially the same across the wafer system 400, although it is understood that the first segment gaps 422 and the second segment gaps 424 may not be substantially the same, such as having different lengths. Yet further for illustrative purposes, the first segments 406 and the second segments 410 of each of the partial cut gridded segments 404 are not in contact, although it is understood that the first segments 406 and the second segments 410 of each of the partial cut gridded segments 404 may be in contact.

Figure 5:
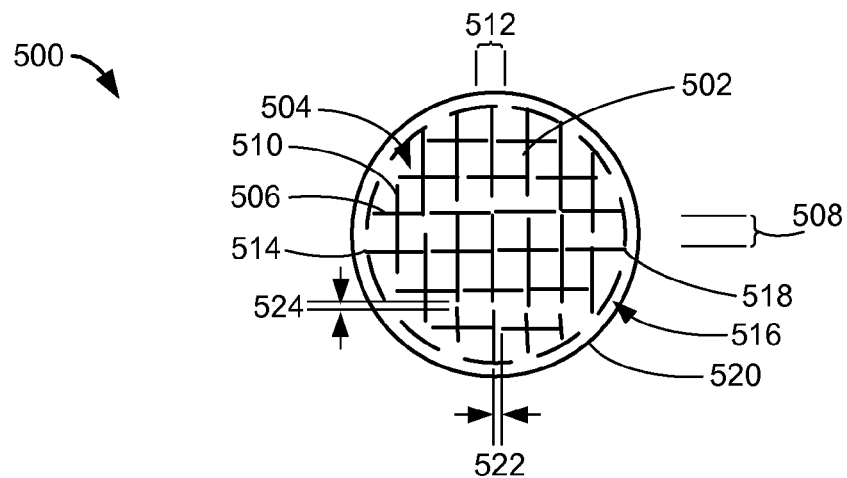
FIG. 5 is a top view of a wafer system in yet another embodiment of the present invention.

Referring now to FIG. 5, therein is shown a top view of a wafer system 500 in yet another embodiment of the present invention. The top view depicts a topside 502 of the wafer system 500. The topside 502 has circuitry (not shown) fabricated thereon. The top view also depicts partial cut intersecting line segments 504 that are substantially parallel to the rows and the columns the integrated circuit dice (not shown) along the topside 502. The partial cut intersecting line segments 504 are half cuts or cuts into the wafer system 500 without traversing through the entire thickness (not shown) of the wafer system 500.

First line segments 506 of the partial cut intersecting line segments 504 are substantially parallel to the rows of the integrated circuit dice and rows 508 of the partial cut intersecting line segments 504. Second line segments 510 of the partial cut intersecting line segments 504 are substantially parallel to the columns of the integrated circuit dice and columns 512 of the partial cut intersecting line segments 504. The first line segments 506 and the second line segments 510 traverses from a first point 514 of a wafer rim 516 to a second point 518 of the wafer rim 516, wherein the first point 514 and the second point 518 are not the same location of the wafer rim 516. The wafer rim 516 may include the integrated circuit die (not shown) and a wafer edge 520 or the integrated circuit die at each end of the row or the column of integrated circuit dice. The wafer rim 516 is at the peripheral region of the wafer system 500.

First segment gaps 522 are shown between the first line segments 506 along the rows 508 of the partial cut intersecting line segments 504. Second segment gaps 524 are shown between the second line segments 510 along the columns 512 of the partial cut intersecting line segments 504. The partial cut intersecting line segments 504 may outline each integrated circuit die (not shown) or multiple integrated circuit dice.

For illustrative purposes, the wafer system 500 is described as having the circuitry along the topside 502, although it is understood that the wafer system 500 may not have circuitry. For example, the wafer system 500 may contain other structures, such as spacer structures, stiffening structures, heat dissipation structures, or microelectricalmechanical systems (MEMS). Also for illustrative purposes, the rows 508 and the columns 512 of the partial cut intersecting line segments 504 are shown as evenly spaced and distributed along the topside 502, although it is understood that the rows 508 and the columns 512 of the partial cut intersecting line segments 504 may not be evenly spaced.

Further for illustrative purposes, the wafer system 500 is shown having the partial cut intersecting line segments 504 as all the cut lines, although it is understood that the wafer system 500 may have different types of cut lines than the partial cut intersecting line segments 504, such as the partial cut chords 104 of FIG. 1. Yet further for illustrative purposes, the first segment gaps 522 and the second segment gaps 524 are shown substantially the same across the wafer system 200, although it is understood that the first segment gaps 522 and the second segment gaps 524 may not be substantially the same, such as having different lengths.

Figure 6:
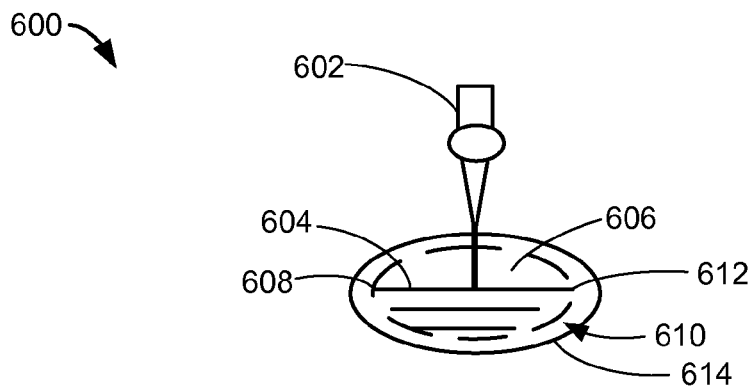
FIG. 6 is an isometric view of a wafer in a partial cut phase in an embodiment of the present invention.

Referring now to FIG. 6, therein is shown an isometric view of a wafer 600 in a partial cut phase in an embodiment of the present invention. A cutting instrument 602, such as a laser, forms partial cut chords 604 on a topside 606 of the wafer 600. The partial cut chords 604 may be similar to the partial cut chords 104 of FIG. 1.

The topside 606 has circuitry (not shown) fabricated thereon. The partial cut chords 604 are formed substantially parallel to the rows the integrated circuit dice (not shown) along the topside 606. The partial cut chords 604 are half cuts or cuts into the wafer 600 to a predetermined depth without traversing through the entire thickness (not shown) of the wafer 600.

Each of the partial cut chords 604 traverses from a first point 608 of a wafer rim 610 to a second point 612 of the wafer rim 610, wherein the first point 608 and the second point 612 are not the same location of the wafer rim 610. The wafer rim 610 may include the integrated circuit die (not shown) and a wafer edge 614 or the integrated circuit die at each end of the row of integrated circuit dice.

For illustrative purposes, the wafer 600 is described as having the circuitry along the topside 606, although it is understood that the wafer 600 may not have circuitry. For example, the wafer 600 may contain other structures, such as spacer structures, stiffening structures, heat dissipation structures, or microelectricalmechanical systems (MEMS).

Figure 7:
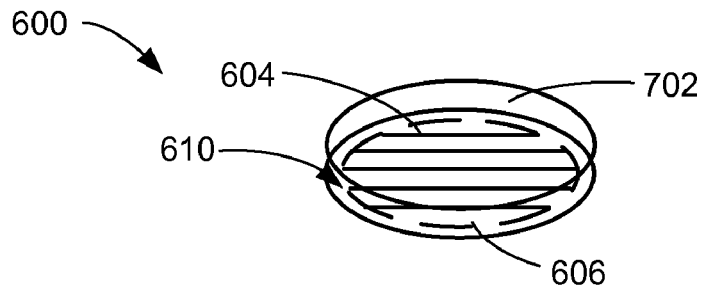
FIG. 7 is the structure of FIG. 6 in a topside-protecting phase.

Referring now to FIG. 7, therein is shown the structure of FIG. 6 in a topside-protecting phase. The wafer 600 has the partial cut chords 604 between the wafer rim 610. A topside protective film 702, such as a laminate, is applied on the topside 606 of the wafer 600. The topside protective film 702 may serve multiple functions, such as protecting the topside 606 or providing planar rigidity for the wafer 600.

Figure 8:
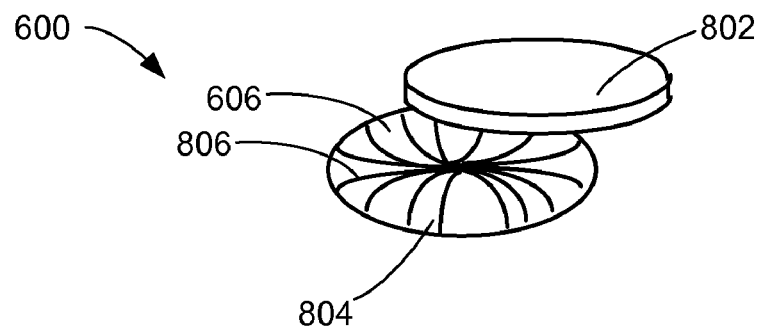
FIG. 8 is the structure of FIG. 7 vertically flipped in a grinding phase.

Referring now to FIG. 8, therein is shown the structure of FIG. 7 vertically flipped in a grinding phase. A grinding instrument 802, such as an abrasive wheel, thins the wafer 600 by grinding a backside 804 of the wafer 600. The backside 804 is the side opposite the topside 606. The wafer 600 is thinned by a predetermined amount. The grinding instrument 802 forms grinding marks 806 on the backside 804. For illustrative purposes, the thinning process is performed by the grinding instrument 802 with abrasive forces on the backside 804, although it is understood that the thinning process may be performed by other processes, such as chemical etching.

Figure 9:
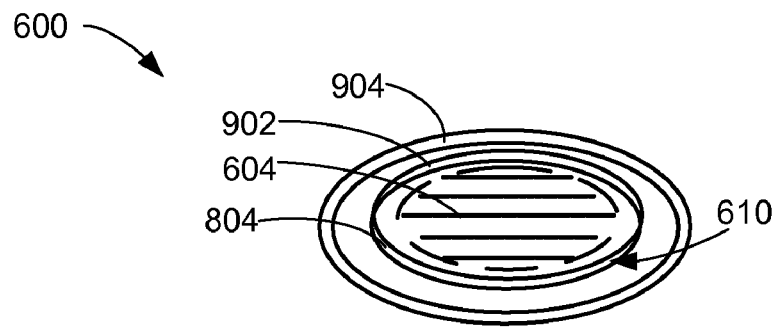
FIG. 9 is the structure of FIG. 8 in a backside-protecting phase.

Referring now to FIG. 9, therein is shown the structure of FIG. 8 in a backside-protecting phase. The wafer 600 has undergone the grinding phase in FIG. 8 exposing in the partial cut chords 604 from the backside 804. A backside protective layer 902, such as a dicing tape or dice attach film (DAF), is mounted over the backside 804 of the wafer 600 inside a carrier ring 904. The carrier ring 904 holds the backside protective layer 902 in a substantially taunt configuration. The backside protective layer 902 may serve multiple functions, such as protecting the backside 804 or providing planar rigidity for the wafer 600. The partial cut chords 604 leaves portions of the wafer 600, such as the wafer rim 610 or between the partial cut chords 604, uncut such that the wafer 600 has structural rigidity to resist warpage.

Figure 10:
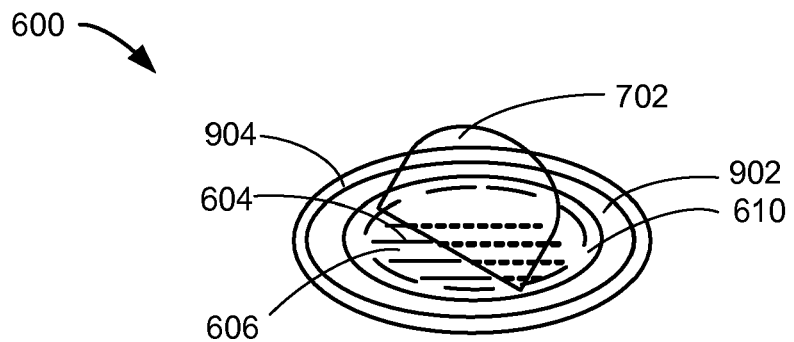
FIG. 10 is the structure of FIG. 9 vertically flipped in a topside-exposing phase.

Referring now to FIG. 10, therein is shown the structure of FIG. 9 vertically flipped in a topside-exposing phase. The wafer 600, the backside protective layer 902, and the carrier ring 904 are vertically flipped from the orientation in FIG. 9. The topside protective film 702 is removed exposing the topside 606 and the partial cut chords 604.

Figure 11:
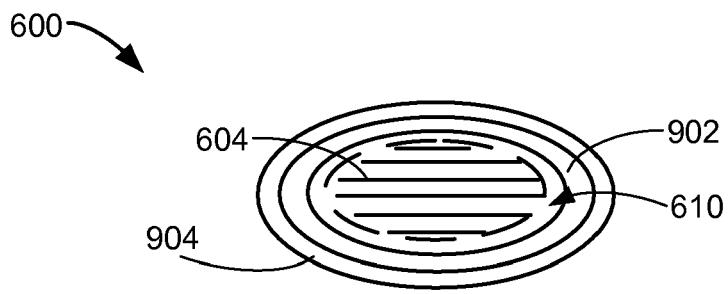
FIG. 11 is the structure of FIG. 10 in a handling phase.

Referring now to FIG. 11, therein is shown the structure of FIG. 10 in a handling phase. The carrier ring 904 holds the backside protective layer 902 in a substantially taunt configuration providing structural support to the wafer 600. As mentioned above, the partial cut chords 604 leaves portions of the wafer 600, such as the wafer rim 610 or between the partial cut chords 604, uncut such that the wafer 600 has structural rigidity to resist warpage.

Figure 12:
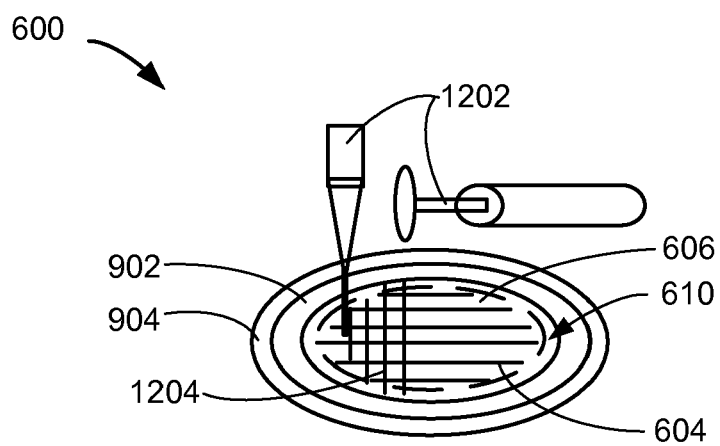
FIG. 12 is the structure of FIG. 11 in a singulating phase.

Referring now to FIG. 12, therein is shown the structure of FIG. 11 in a singulation phase. A singulation instrument 1202, such as a laser or a saw, forms singulation lines 1204 on the topside 606 of the wafer 600. The singulation lines 1204 intersect and are perpendicular to the partial cut chords 604. The carrier ring 904 and the backside protective layer 902 continue to provide structural support. The singulation lines 1204 may extend to the wafer rim 610 or through the wafer rim 610.

Figure 13:
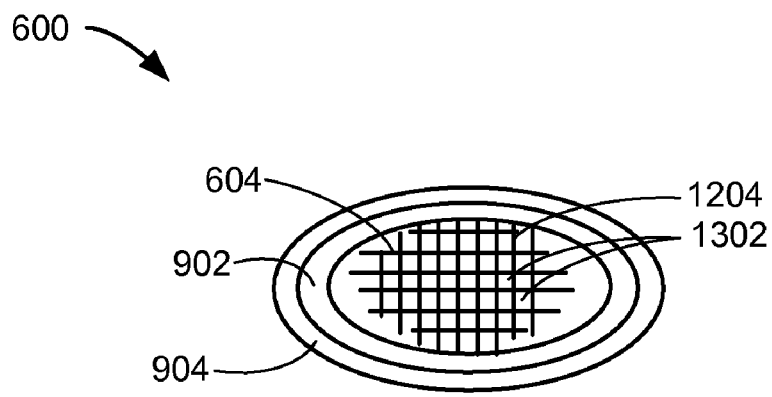
FIG. 13 is the structure of FIG. 12 in a separating phase.

Referring now to FIG. 13, therein is shown the structure of FIG. 12 in a separating phase. The carrier ring 904 and the backside protective layer 902 continue to provide structural support to the wafer 600. The wafer 600 has the partial cut chords 604 exposed at the backside 804 of FIG. 9 from the thinning process. The singulation lines 1204 form the outline of singulation elements 1302, such as integrated circuit dice, of the wafer 600. Each of the singulation elements 1302 may be removed by a number of different processes, such as punch with pick and place.

Figure 14:
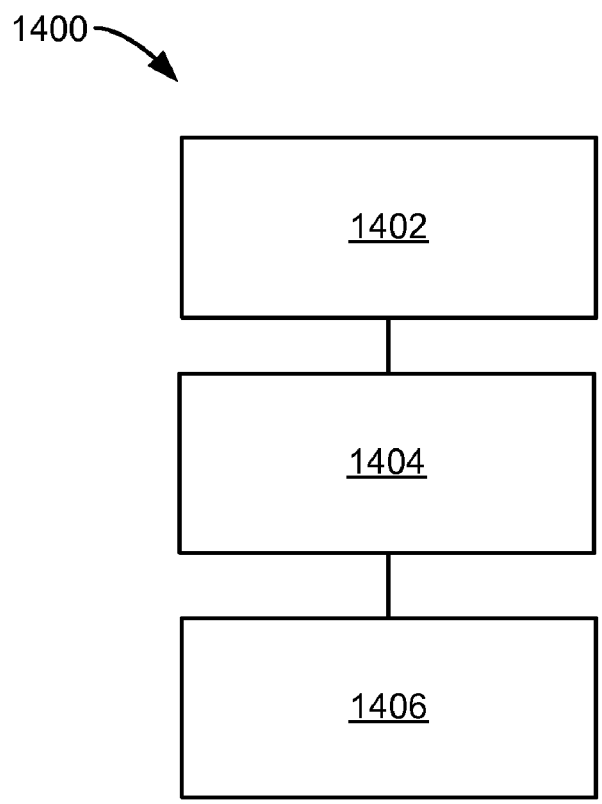
FIG. 14 is a flow chart of a wafer system for manufacture of the wafer system in an embodiment of the present invention.

Referring now to FIG. 14, therein is shown a flow chart of a wafer system 1400 for manufacture of the wafer system 100 in an embodiment of the present invention. The system 1400 includes providing a wafer having a topside and a backside in a block 1402; forming a partial cut from the topside of the wafer within a wafer rim in a block 1404; and thinning the wafer from the backside for exposing the partial cut at the backside within the wafer rim in a block 1406.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the wafer system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of singulating a wafer comprising:
   providing a wafer having a topside and a backside;
   forming partial cuts from the topside of the wafer within a wafer rim, the partial cuts all formed in one direction;
   thinning the wafer from the backside for exposing the partial cuts at the backside within the wafer rim; and
   singulating the wafer with a singulation line in a second direction different from the one direction after thinning the wafer.

2. The method as claimed in claim 1 wherein forming the partial cut from the topside of the wafer includes forming a partial cut chord between a first point and a second point, different from the first point, of the wafer rim.

3. The method as claimed in claim 1 wherein forming the partial cut from the topside of the wafer includes forming partial cut line segments having a segment gap.

4. The method as claimed in claim 1 wherein forming the partial cut from the topside of the wafer includes forming a partial cut jogged segment having a corner formed from a first segment and a second segment of the partial cut jogged segment.

5. The method as claimed in claim 1 wherein forming the partial cut from the topside of the wafer includes forming a partial cut gridded segment having a first segment and a second segment perpendicular to the first segment.

6. The method as claimed in claim 1 wherein forming the partial cut from the topside of the wafer includes forming partial cut intersecting line segments having first line segments and second line segments perpendicular to the first line segments.

7. The method as claimed in claim 1 further comprising forming a singulation line intersecting the partial cut.

8. The method as claimed in claim 1 wherein forming the partial cut from the topside of the wafer includes outlining a singulation element.

9. The method as claimed in claim 1 further comprising separating a singulation element from the wafer.

10. The method as claimed in claim 1 further comprising forming partial cuts of different configurations in the wafer.

11. A method of singulating a wafer comprising:
    providing a wafer having a topside, a backside, and a wafer rim at a peripheral region of the wafer;
    forming partial cuts from the topside of the wafer within the wafer rim without reaching the backside, the partial cuts all formed in one direction;
    thinning the wafer from the backside for exposing the partial cuts at the backside within the wafer rim; and
    forming a singulation line in the wafer from the topside and intersecting the partial cuts after thinning the wafer.

12. The method as claimed in claim 11 further comprising mounting a topside protective film over the topside of the wafer having the partial cut.

13. The method as claimed in claim 11 further comprising mounting a backside protective layer over the backside of the wafer having the partial cut exposed at the backside.

14. The method as claimed in claim 11 further comprising supporting the wafer with a carrier ring.

15. The method as claimed in claim 11 wherein forming the partial cut in the wafer includes lasing the partial cut.

16. The method as claimed in claim 11 wherein forming the singulation line in the wafer includes lasing the singulation line.

17. The method as claimed in claim 11 wherein forming the singulation line in the wafer includes sawing the singulation line.

18. The method as claimed in claim 11 wherein forming the singulation line in the wafer includes forming the singulation line to the backside of the wafer.

19. The method as claimed in claim 11 wherein forming the wafer having the topside includes forming a circuit along the topside.

20. The method as claimed in claim 11 further comprising separating an integrated circuit die from the wafer.

\* \* \* \* \*